(12) United States Patent
Senbonmatsu

(10) Patent No.: US 7,034,451 B2
(45) Date of Patent: Apr. 25, 2006

(54) SELF LIGHT EMITTING DISPLAY DEVICE

(75) Inventor: Shigeru Senbonmatsu, Chiba (JP)

(73) Assignee: Seiko Instruments Inc., Chiba (JP)

( * ) Notice: Subject to any disclaimer, the term of this patent is extended or adjusted under 35 U.S.C. 154(b) by 250 days.

(21) Appl. No.: 10/644,708

(22) Filed: Aug. 20, 2003

(65) Prior Publication Data

US 2004/0070809 A1    Apr. 15, 2004

(30) Foreign Application Priority Data

Aug. 30, 2002   (JP)   ............................. 2002-254882

(51) Int. Cl.
*H05B 33/00*   (2006.01)

(52) U.S. Cl. ...................................... 313/498; 313/512

(58) Field of Classification Search ........ 313/498–512, 313/110–112
See application file for complete search history.

(56) References Cited

U.S. PATENT DOCUMENTS 5,831,375 A  *  11/1998  Benson, Jr. ................. 313/110
6,057,814 A  *   5/2000  Kalt ............................ 345/58

* cited by examiner

*Primary Examiner*—Joseph Williams
(74) *Attorney, Agent, or Firm*—Adams & Wilks

(57) ABSTRACT

Provided is a technique for producing a double-sided display device using a self light emitting display element in which a thickness thereof is small, a contrast is high, and a privacy is kept. A first polarization layer and a second polarization layer are provided so as to sandwich the self light emitting display element and it is set such that the transmission axis of the first polarization layer and the transmission axis of the second polarization layer are orthogonal to each other.

15 Claims, 9 Drawing Sheets

PRIOR ART

211

213

PRIOR ART

FIG. 12
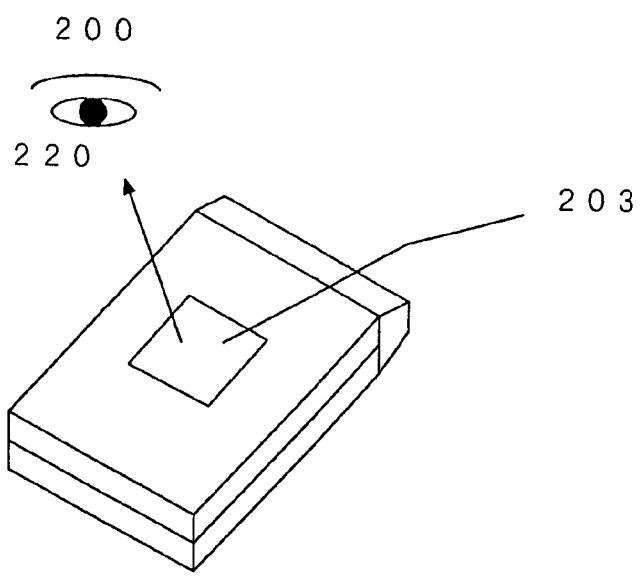
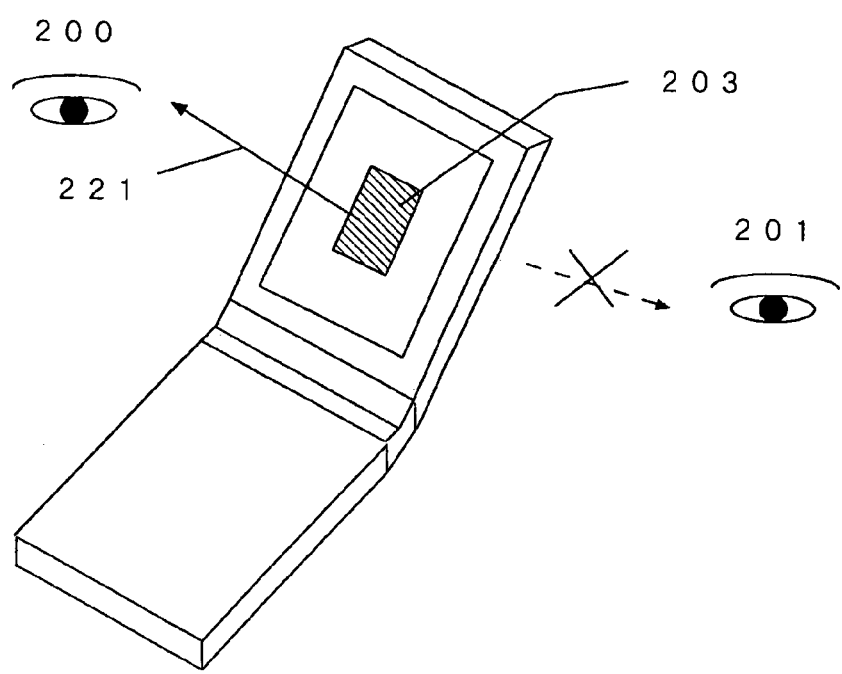
FIG. 13

SELF LIGHT EMITTING DISPLAY DEVICE

BACKGROUND OF THE INVENTION

The present invention relates to a display device using a light emitting element of a self light emission type, such as an EL (electroluminescence) element that emits light by application of a voltage.

An EL element is a light emitting element having a great potential because light emission is produced at a relatively low voltage and manufacturing thereof is easy. An element life, which has been a problem in a practical use of the EL element, now reaches a practical level. Accordingly, the EL element is beginning to be adopted for an in-car audio system and a mobile telephone.

FIG. 6 shows a structure of a conventional EL element. As shown in FIG. 6, in the EL element, a transparent electrode 31 made of indium tin oxide (ITO) or the like, a hole transporting layer 32, a light emitting layer 33, and an electrode 34 made of aluminum or the like are laminated in succession on a substrate 1 made of glass or the like. Here, an EL element portion 11 is composed of the transparent electrode 31, the hole transporting layer 32, the light emitting layer 33, and the electrode 34.

According to the EL element, the transparent electrode 31 is used as an anode and the electrode 34 is used as a cathode. Holes and electrons which are injected from the anode and the cathode, respectively, are recombined in the light emitting layer 33, thereby emitting EL light 211. The EL light 211 transmits through the substrate 1 and is emitted externally of the EL element.

Other than the structure of the organic EL element shown in FIG. 6, there are various structures, for example, (1) a structure having an anode, a light emitting layer, and a cathode, (2) a structure having the anode, a hole transporting layer, the light emitting layer, an electron transporting layer, and the cathode, (3) a structure having the anode, the light emitting layer, the electron transporting layer, and the cathode, and (4) a structure having the anode, a hole injection layer, the hole transporting layer, the light emitting layer, and the cathode.

Also, FIG. 7 shows a conventional structure of another EL element. As shown in FIG. 7, in the EL element, a transparent electrode 31 made of ITO or the like, a hole transporting layer 32, a light emitting layer 33, and an electrode 35 made of aluminum or the like are laminated on a substrate 1. Here, an EL element portion 12 is composed of the transparent electrode 31, the hole transporting layer 32, the light emitting layer 33, and the electrode 35. According to the EL element, the transparent electrode 31 is used as the anode and the electrode 35 is used as the cathode. Holes and electrons which are injected from the anode and the cathode, respectively, are recombined in the light emitting layer 33, thereby emitting EL light 213. At this time, when a film thickness of the electrode 35 is sufficiently small (for example, 20 nm or less), EL light 212 transmits through the electrode 35 and is emitted externally of the EL element.

Also, FIG. 8 shows another structural example of a conventional EL element. In the EL element, a transparent electrode 31 made of ITO or the like, a hole transporting layer 32, a light emitting layer 33, an electron transporting layer 36, and an electrode 37 made of ITO or the like are laminated on a substrate 1. Here, an EL element portion 13 is composed of the transparent electrode 31, the hole transporting layer 32, the light emitting layer 33, an electron transporting layer 36, and the electrode 37. The EL element having such a structure has been proposed by J. Kido et al., Yamagata University. Here, the transparent electrode 31 is used as the anode and the electrode 37 is used as the cathode. Holes and electrons which are injected from the anode and the cathode, respectively, are recombined in the light emitting layer 33, thereby emitting EL light 214 and EL light 215 as shown in FIG. 8. The EL light 215 transmits through the substrate 1 and is emitted externally of the EL element. The EL light 214 transmits through the electrode 37 and is emitted externally of the EL element.

The EL element as shown in FIG. 7 or 8 is transparent in a state in which no voltage is applied thereto, and emits EL light when the voltage is applied thereto. A display device in which a light emission pattern is emerged on such a transparent background is called a see-through display device, and display devices for automobile use and the like have been proposed.

FIG. 4 shows an example of a double-sided display device in which the EL element shown in FIG. 6 is applied to a display device of a folding mobile telephone having a rear display device. The double-sided display device has a structure in which two EL elements, each of which is obtained by forming the EL element portion 2 on the substrate 1 and has a sealing structure 3 that shuts out air are laminated such that the surface of one sealing structure 3 is bonded to the surface of the other sealing structure 3. Each of the EL elements emits the EL light 211 by application of a voltage. Such a structure has a thickness corresponding to two EL elements. Therefore, there is a limitation with respect to a display device for mobile telephone use, for which a reduction in thickness is required.

FIG. 5 shows another example in which the EL element shown in FIG. 7 is applied to a double-sided display device of the folding mobile telephone having the rear display device. The double-sided display device is obtained by forming the EL element portion 12 on the substrate 1 and has a sealing structure 3 that shuts out air. When a program for a driver circuit is switched over, display contents resulting from the EL light 212 and the EL light 213 can be visually identified in both surfaces. However, there is the following problem with respect to the double-sided display device having such a structure. The problem will be described with reference to FIG. 11. An EL cell 100 shown in FIG. 11 has an EL element structure in which light is emitted from both surfaces as shown in FIG. 7 or 8. EL light 121 and EL light 123 are emitted from a light emitting portion 101 by application of a voltage. An observer 200 visually identifies a display content resulting from the EL light 121. In addition, external light 130 and external light 132 transmit through the EL cell 100, thereby respectively becoming transmission light 131 and transmission light 133. Further, a part of the external light 130 is reflected on a substrate surface of the EL cell 100 and in an inner portion thereof at several %, thereby becoming reflection light 134. Therefore, the observer 200 visually identifies the transmission light 133 and the reflection light 134 together with the EL light 121, so that there is a problem in that a contrast is reduced. In addition, the EL light 123 is emitted to an opposite side to the observer 200. Accordingly, for example, when the EL cell 100 is applied to the folding mobile telephone, there is a fear that a display content resulting from the EL light 123 is caught by others.

As described above, when the display device which can be observed from both surfaces is composed of the self light emitting display element, there is the problem in that the contrast is reduced.

SUMMARY OF THE INVENTION

The present invention has been made in view of the above circumstances. An object of the present invention is to provide a technique for producing an EL double-sided display device in which a thickness thereof is small, a contrast is high, and a privacy is kept.

Therefore, a self light emitting display device of the present invention has the following structures. A self light emitting display device according to one aspect of the present invention includes a self light emitting element; and a first polarization layer and a second polarization layer which sandwich therebetween the self light emitting element, and in the self light emitting display device, a transmission axis of the first polarization layer is orthogonal to a transmission axis of the second polarization layer.

Further, a self light emitting display device according to another aspect of the present invention includes a self light emitting element; a first polarization layer and a second polarization layer which sandwich therebetween the self light emitting element; a first optical phase differential layer (retardation: $\Delta n_1 d_1$) provided between the self light emitting element and the first polarization layer; and a second optical phase differential layer (retardation: $\Delta n_2 d_2$) provided between the self light emitting element and the second polarization layer, and in the self light emitting displayed device, a transmission axis of the first polarization layer is parallel to a transmission axis of the second polarization layer, a delay phase axis of the optical anisotropy of the first optical phase differential layer ($\Delta n_1 d_1$) is parallel to a delay phase axis of the optical anisotropy of the second optical phase differential layer ($\Delta n_2 d_2$) and an angle produced by the delay phase axis and the transmission axis of the first polarization layer is set to block external light, and values of $\Delta n_1 d_1$ and $\Delta n_2 d_2$ with respect to light having a wavelength $\ddot{e}$ (or $\lambda$) of 400 nm to 700 nm satisfy:

$\Delta n_1 d_1 / \ddot{e} = 0.25 + m/2 \pm 0.05$ ($m = 0, 1, 2, \ldots$); and $\Delta n_2 d_2 / \ddot{e} = 0.25 + m/2 \pm 0.05$ ($m = 0, 1, 2, \ldots$).

According to the structure, a double-sided display device in which a thickness thereof is small and a contrast is high can be realized.

Further, a display portion closing mechanism that masks at least a portion of a light emitting region of the self light emitting element is provided. In addition, the self light emitting display device is produced as a device having a foldable structure. The display portion closing mechanism is automatically opened or closed in accordance with a folding state of the device. When the device is in a folded state, the display portion closing mechanism is opened. When the device is in an open state, the display portion closing mechanism is closed. According to the structure, a folding self light emitting display device capable of protecting secrets can be realized.

BRIEF DESCRIPTION OF THE DRAWINGS

In the accompanying drawings:

FIG. 12 is an explanatory view showing a closed state of a folding portable information device using an organic EL element of the present invention;

FIG. 13 is an explanatory view showing an opened state of the folding portable information device using the organic EL element of the present invention.

DETAILED DESCRIPTION OF THE PREFERRED EMBODIMENT

Figure 1:
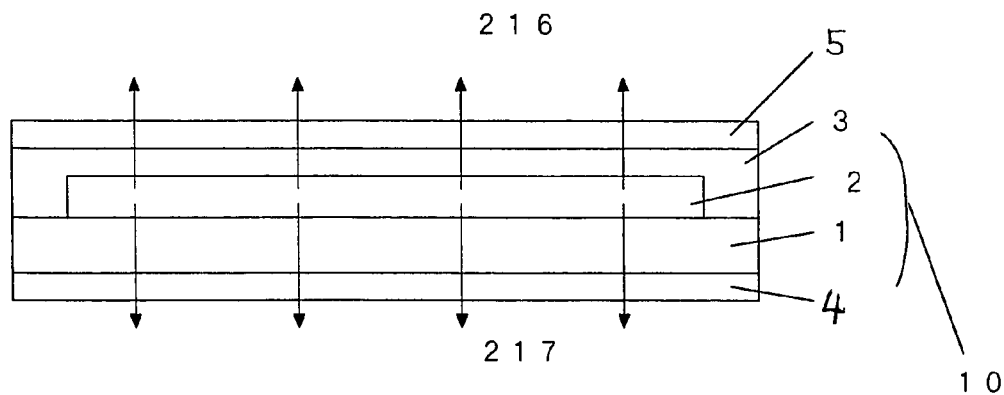
FIG. 1 is a schematic view showing a sectional structure of an organic EL device according to an embodiment of the present invention.

Hereinafter, a self light emitting display device of the present invention will be described.

In order to sandwich a self light emitting display element such as an EL device, polarization layers are provided in both sides of the self light emitting display element such that transmission axes thereof are orthogonal to each other.

A display principle of a self light emitting display device having such a structure will be described below. A first polarization layer and a second polarization layer are disposed in both sides of the self light emitting display element. The transmission axis of the first polarization layer is orthogonal to the transmission axis of the second polarization layer. Here, the self light emitting display element emits light in both side directions (first polarization layer side direction and second polarization layer side direction). That is, the light emitted from the self light emitting display element transmits through the second polarization layer having the transmission axis L6. Accordingly, an observer visually identifies the transmitted light as polarized light. On the other hand, polarized light that transits through the first polarization layer having the transmission axis L7 is emitted to the external. In addition, external light incident from the first polarization layer side becomes linearly polarized light by transmitting through the first polarization layer, and transmits through the self light emitting display element, and is absorbed in the second polarization layer. On the other hand, external light incident from the second polarization layer side becomes linearly polarized light by transmitting through the second polarization layer, transmits through the self light emitting display element, and is absorbed in the first polarization layer. Therefore, the observer in the second polarization layer side observes the polarized light (light polarized by transmitting through the second polarization layer) on a black background and thus can visually identify a display content at high contrast. In addition, when the observer observes the light polarized by transmitting through the first polarization layer from the first polarization layer side, the same effect is obtained.

Further, the self light emitting display device according to the present invention includes: a first polarization layer and a second polarization layer which are provided to sandwich the self light emitting element; a first optical phase differential layer (retardation:$Δn_1d_1$) provided between the self light emitting element and the first polarization layer; and a second optical phase differential layer (retardation: $Δn_2d_2$) provided between the self light emitting element and the second polarization layer. Here, $Δn$ is optical anisotropy and d is a thickness of the optical phase differential layer. A transmission axis of the first polarization layer is parallel to a transmission axis of the second polarization layer, a delay phase axis of the optical anisotropy of the first optical phase differential layer ($Δn_1d_1$) is parallel to a delay phase axis of the optical anisotropy of the second optical phase differential layer ($Δn_2d_2$) and an angle produced by the delay phase axis and the transmission axis of the first polarization layer is set to block external light, and values of $Δn_1d_1$ and $Δn_2d_2$ with respect to light having a wavelength ë of 400 nm to 700 nm satisfy the following equations.

$$Δn_1d_1/ë=0.25+m/2±0.05\ (m=0, 1, 2, \ldots)$$

$$Δn_2d_2/ë=0.25+m/2±0.05\ (m=0, 1, 2, \ldots)$$

A display principle of a self light emitting display device having such a structure will be described below.

The first polarization layer and the second polarization layer are provided on both surfaces of the self light emitting element that emits light to both front and rear sides. That is, of light emitted from the self light emitting element, light transmitting through the second optical phase differential layer transmits through the second polarization layer and can be visually identified as the polarized light by the observer. On the other hand, light transmitting through the first optical phase differential layer transmits through the first polarization layer and is emitted to the external of the display device as the polarized light. In addition, external light incident from the second polarization layer side becomes linearly polarized light by transmitting through the second polarization layer having the transmission axis L1, and transmits through the second optical phase differential layer having the delay phase axis L2. At this time, the light is converted into, for example, right circularly polarized light. The right circularly polarized light is separated into right circularly polarized light transmitting through the self light emitting element and left circularly polarized light reflected on the surface of the self light emitting element and inner electrodes thereof. The right circularly polarized light transmitting through the self light emitting element becomes linearly polarized light by transmitting through the first optical phase differential layer having the delay phase axis L3 and is absorbed in the first polarization layer having the transmission axis L4. In addition, the reflected left circularly polarized light becomes linearly polarized light by transmitting through the second optical phase differential layer and is absorbed in the second polarization layer having the transmission axis L1. Here, clockwise circularly polarized light is defined as the right circularly polarized light and counterclockwise circularly polarized light is defined as the left circularly polarized light.

Also, external light incident from the first polarization layer side becomes linearly polarized light by transmitting through the first polarization layer having the transmission axis L4, and transmits through the first optical phase differential layer having the delay phase axis L3. At this time, the light is converted into, for example, left circularly polarized light. The left circularly polarized light is separated into left circularly polarized light transmitting through the self light emitting element and right circularly polarized light reflected on the surface of the self light emitting element and inner electrodes thereof. The left circularly polarized light transmitting through the self light emitting element becomes linearly polarized light by transmitting through the second optical phase differential layer having the delay phase axis L2 and is absorbed in the second polarization layer having the transmission axis L1. On the other hand, the right circularly polarized light reflected on the self light emitting element transmits through the first optical phase differential layer. At this time, the transmitted light is converted into linearly polarized light and absorbed in the first polarization layer having the transmission axis L4.

As described above, the observer visually identifies only the polarized light on the black background. Therefore, a self light emitting display device having an extremely high contrast is obtained. In addition, when the observer observes a display content from the opposite side, the same effect is obtained.

Hereinafter, an organic EL device of the present invention will be more specifically described through embodiments.

(Embodiment 1)

FIG. 1 is a schematic sectional view showing an organic EL device of this embodiment. As shown in FIG. 1, an organic EL element portion 2 is formed on the surface of a substrate 1. The organic EL element portion 2 is sealed with a sealing structure 3, thereby composing an organic EL cell 10. A first polarization layer 4 and a second polarization layer 5 are disposed at both ends of the organic EL cell such that transmission axes thereof are orthogonal to each other.

Figure 10:
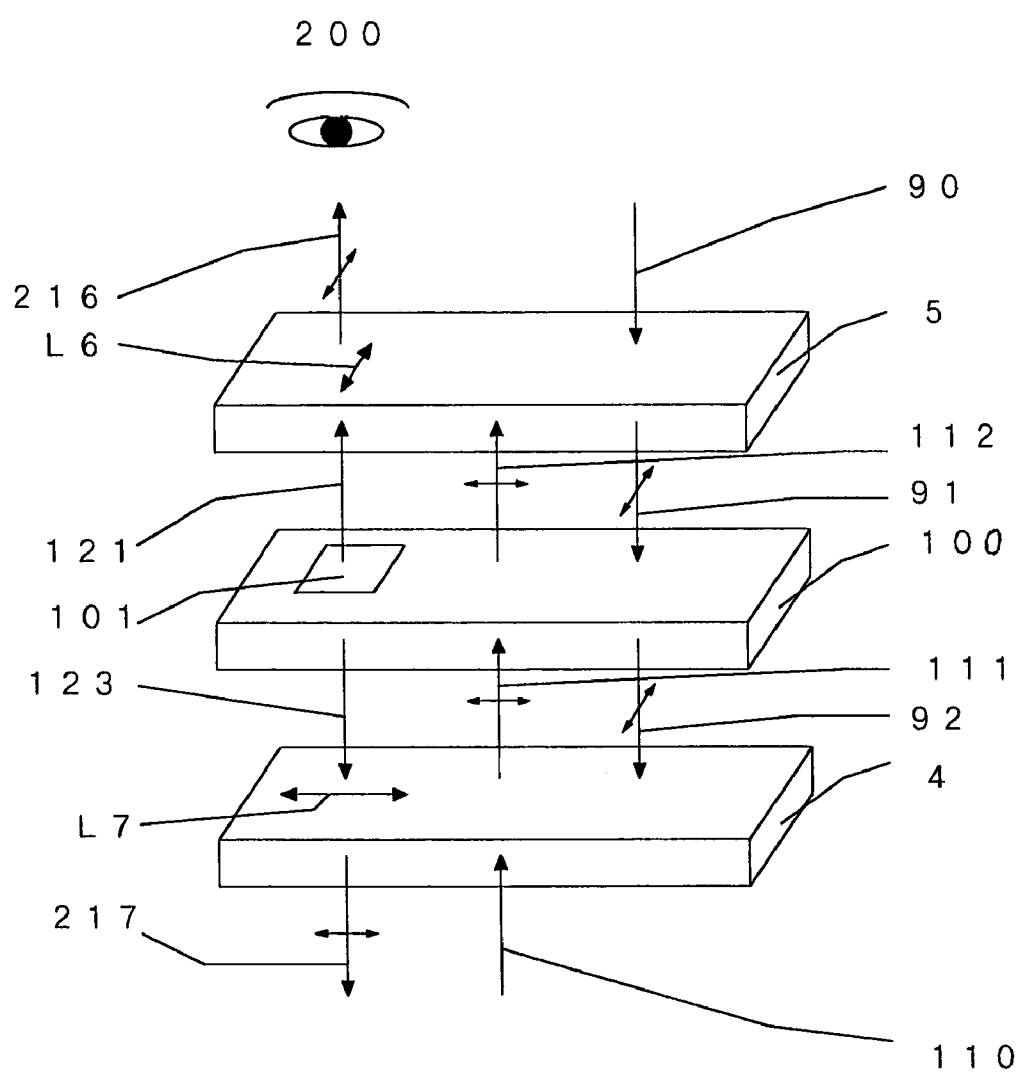
FIG. 10 is an explanatory view showing a display principle of the embodiment of the present invention.
Figure 11:
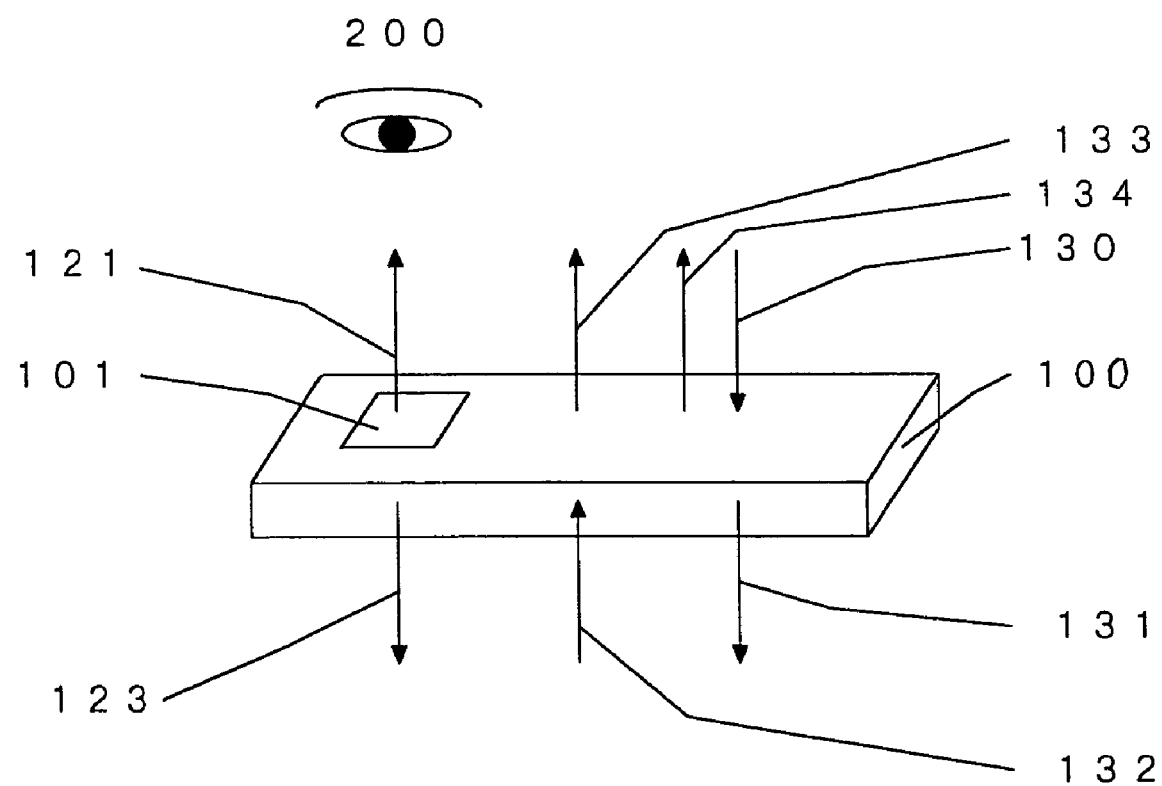
FIG. 11 is an explanatory view showing an observation principle of the conventional organic EL element.

A display principle of an organic EL device having such a structure will be described with reference to FIG. 10. The first polarization layer 4 and the second polarization layer 5 are disposed at both sides of the organic EL cell 10. A transmission axis L7 of the first polarization layer 4 is orthogonal to a transmission axis L6 of the second polarization layer 5. EL light 121 emitted from a light emitting portion 101 of the organic EL cell 10 transmits through the second polarization layer 5 having the transmission axis L6. Accordingly, an observer 200 visually identifies the transmitted light as polarized EL light 216. On the other hand, EL light 123 emitted from the light emitting portion 101 of the organic EL cell 10 transmits through the first polarization layer 4 having the transmission axis L7. Polarized EL light 217 is emitted to the exterior. In addition, external light 110 transmitting through the first polarization layer 4 is converted into linearly polarized light 111, becomes linearly polarized light 112 by transmitting through the organic EL cell 10, and is absorbed in the second polarization layer 5. On the other hand, external light 90 transmitting through the second polarization layer 5 is converted into linearly polarized light 91, becomes linearly polarized light 92 by transmitting through the organic EL cell 10, and is absorbed in the first polarization layer 4. Therefore, the observer 200 observes the polarized EL light 216 on the black background and thus can visually identify a display content at high contrast. In addition, when the observer observes the polarized EL light 217 from the opposite side, the same effect is obtained.

Here, it is preferable that the substrate 1 is a plate made of glass in view of heat resistance, chemical resistance, transparency, and the like. In this embodiment, no alkali grinding glass having a thickness of 0.7 mm is used. In addition, a polarizing plate is used for the first polarization layer 4 and the second polarization layer 5. A plate made of glass is used for the sealing structure 3, a moisture absorption material made of an Ar gas and BaO is filled into the inside of the sealing structure 3, and the sealing structure 3 is sealed with a UV curable resin at the periphery thereof, thereby composing the organic EL cell 10. It has been known already that a life of the organic EL element portion 12 is reduced by moisture. Accordingly, in addition to the above-mentioned structure, a sealing structure 3 can be realized without using a sealing substrate by, for example, a sealing method of forming an inorganic protective layer made of $SiN_xO_y$ or the like by vacuum film formation such as CVD, or a sealing method of forming an organic protective layer by printing or the like.

Figure 7:
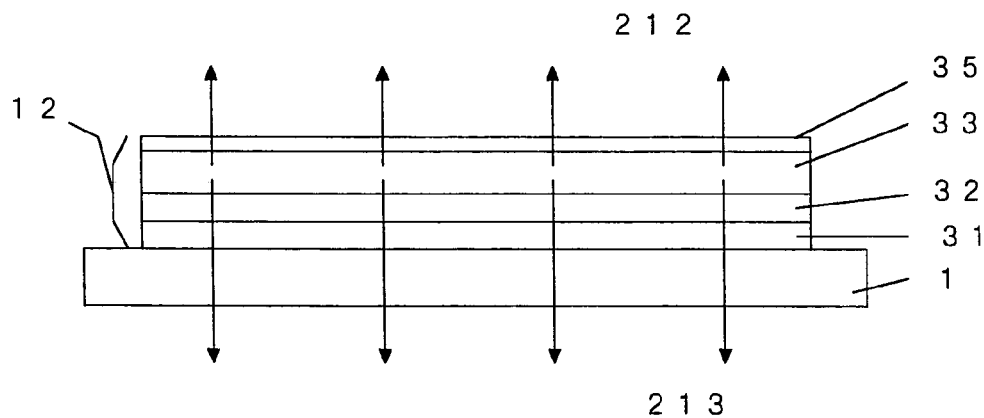
FIG. 7 is an explanatory view showing an example of a structure of the conventional organic EL element.
Figure 8:
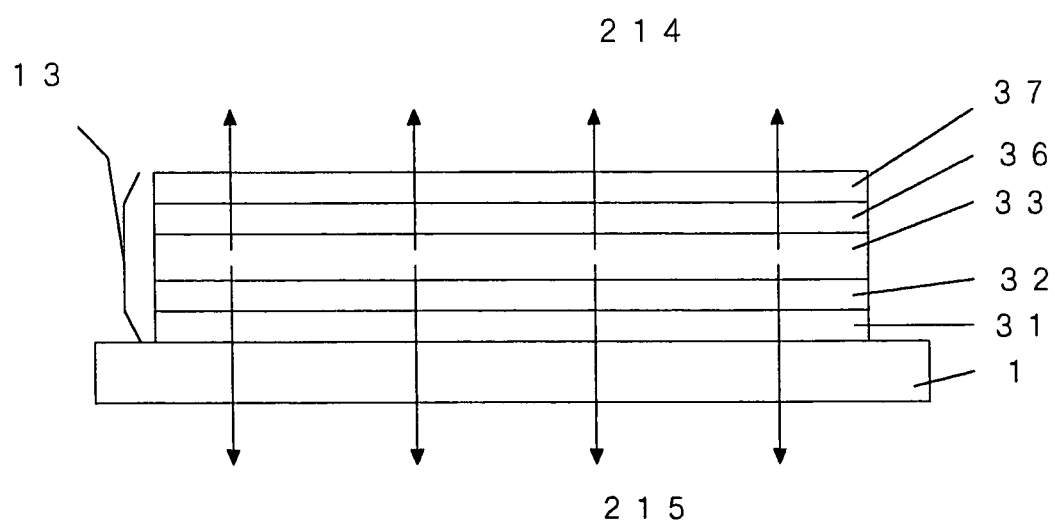
FIG. 8 is an explanatory view showing an example of a structure of a conventional organic EL element.

Also, in this embodiment, as shown in FIG. 7, the organic EL element portion 2 is composed of the transparent electrode 31, the hole transporting layer 32, the light emitting layer 33, and the electrode 35. With respect to an organic layer (hole transporting layer 32 and light emitting layer 33), there are a low molecular system organic EL layer and a polymer system organic EL layer, and any of the layers can be used. Of these layers, the low molecular system organic EL layer is more preferable because of easy manufacturing, low operating voltage, and the like. With respect to the structure of the organic EL element portion 2, there are various structures, for example, (1) a structure having an anode, a light emitting layer, and a cathode, (2) a structure having the anode, a hole transporting layer, the light emitting layer, an electron transporting layer, and the cathode, (3) a structure having the anode, the light emitting layer, the electron transporting layer, and the cathode, and (4) a structure having the anode, the hole transporting layer, the light emitting layer, and the cathode. In the present invention, the conventional various structures can be used without modification.

The anode (electrode 31) can be made of a conductive transparent material such as indium tin oxide (ITO). It is preferable that a thickness of the electrode 31 is 50 nm to 600 nm. In this embodiment, an indium tin oxide (ITO) electrode having a thickness of 150 nm is used. The hole transporting layer can be made of á-NPD (á-naphthyl phenyl diamine) or the like. A thickness of the hole transporting layer is preferably 5 nm to 45 nm, more preferably 10 nm to 40 nm. In this embodiment, an á-NPD layer having a thickness of 50 nm is used. The light emitting layer can be made of a tris (8-quinolinolato) aluminum complex (Alq3) or the like. A thickness of the light emitting layer is preferably 5 nm to 45 nm, more preferably 10 nm to 40 nm. In this embodiment, Alq3 is formed at 50 nm.

The cathode (electrode 35) can be composed of a two-layer structure having a first cathode layer and a second cathode layer. The first cathode layer can be made of lithium fluoride (LiF) and a thickness thereof is preferably 0.1 nm to 2 nm. The second cathode layer is preferably made of aluminum and a thickness thereof is preferably 5 nm to 20 nm. In this embodiment, a lithium fluoride (LiF) layer having a thickness of 0.5 nm is used for the first cathode layer and an aluminum layer having a thickness of 15 nm is used for the second cathode layer.

The respective layers described above are known by persons skilled in the art and can be formed by a method known by persons skilled in the art, such as sputtering or a vacuum evaporation method.

According to a detailed structure described above, when a voltage is applied between the transparent electrode 31 and the electrode 35 of the organic EL element portion 2, the organic EL element portion 2 emits light. Accordingly, the polarized EL light 217 of a color of green can be taken through the first polarization layer 4 and the polarized EL light 216 of green can be taken through the second polarization layer 5. In addition, in this embodiment, Alq3 is used for the light emitting layer 33. When color display is conducted, for example, a light emitting layer doped with an adequate coloring matter is used. Needless to say, it is possible that light emitting layers are formed in matrix on a substrate and simple matrix drive or active matrix drive using a combination with TFT elements is conducted.

(Embodiment 2)

Figure 2:
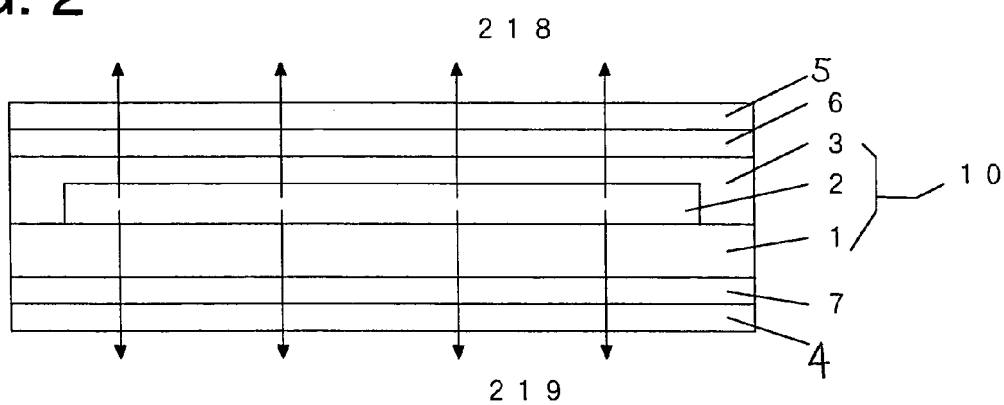
FIG. 2 is a schematic view showing a sectional structure of an organic EL device according to another embodiment of the present invention.

FIG. 2 is a schematic view showing a sectional structure of an organic EL device according to Embodiment 2. Note that the description of the organic EL cell 10 overlapped with Embodiment 1 is omitted here as appropriate. As shown in FIG. 2, the organic EL device includes a first polarization layer 4 and a second polarization layer 5 which sandwich therebetween the organic EL cell 10; a first optical phase differential layer 7 (retardation: $Än_1d_1$, where Än is optical anisotropy and d is a thickness) provided between the organic EL cell 10 and the first polarization layer 4; and a second optical phase differential layer 6 (retardation: $Än_2d_2$) provided between the organic EL cell 10 and the second polarization layer 5. A transmission axis of the first polarization layer 4 is parallel to a transmission axis of the second polarization layer 5, a delay phase axis of the optical anisotropy of the first optical phase differential layer 7 ($Än_1d_1$) is parallel to a delay phase axis of the optical anisotropy of the second optical phase differential layer 6 ($Än_2d_2$) and an angle produced by the delay phase axis and the transmission axis of the first polarization layer is set to block external light, and values of $Än_1d_1$ and $Än_2d_2$ with respect to light having a wavelength of 400 nm to 700 nm satisfy the following equations.

$$Än_1d_1/ë=0.25+m/2\pm0.05\ (m=0, 1, 2, \ldots)$$

$$Än_2d_2/ë=0.25+m/2\pm0.05\ (m=0, 1, 2, \ldots)$$

Note that, in this embodiment, a stretched film made of polycarbonate is used for the optical phase differential layers. In addition, it is set such that the delay phase axes of the optical anisotropy of the optical phase differential layers become 45° with respect to the transmission axis of the first polarization layer.

Figure 9:
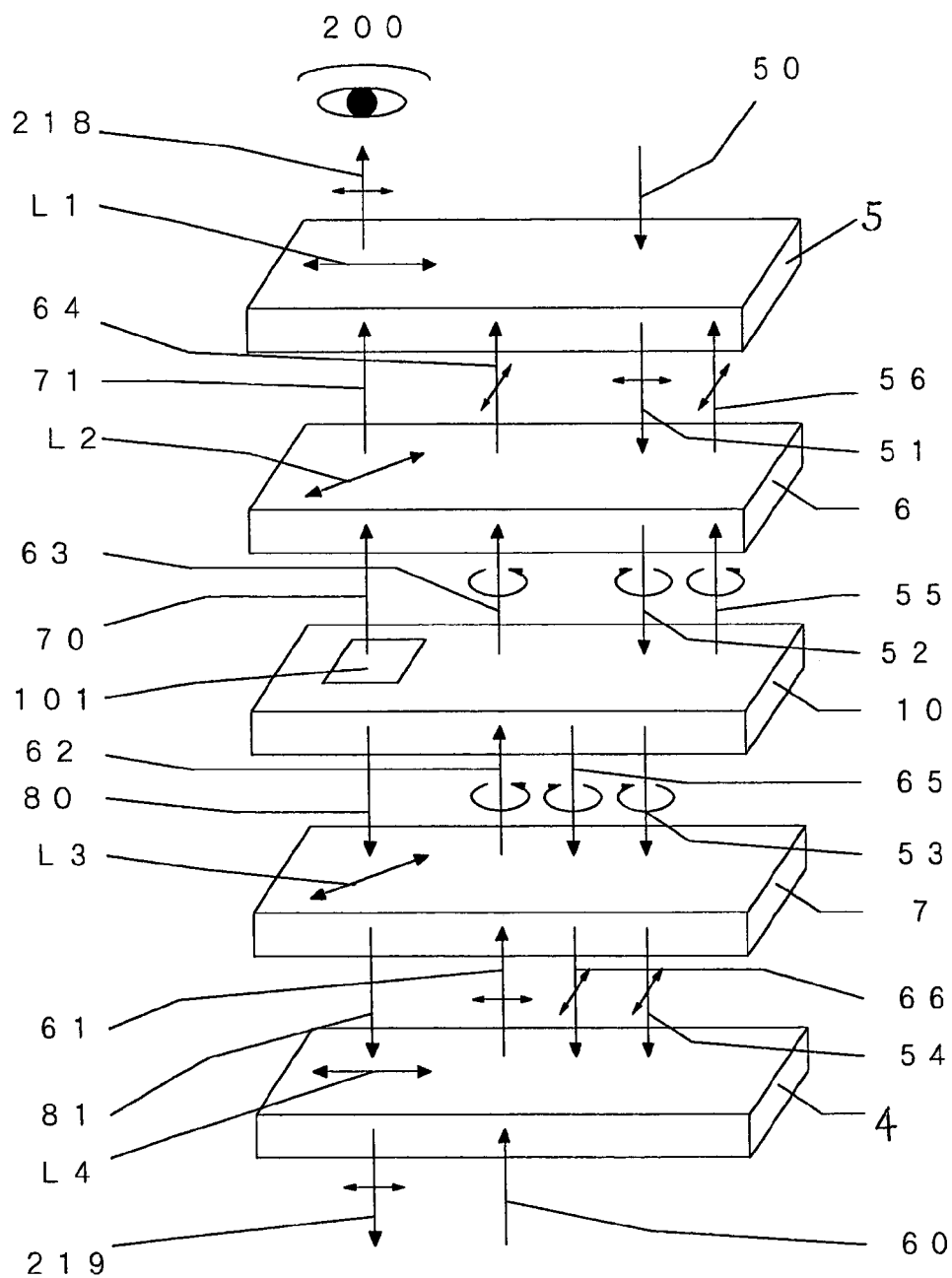
FIG. 9 is an explanatory view showing a display principle of the embodiment of the present invention.

A display principle of an organic EL device having such a structure will be described with reference to FIG. 9.

EL light 70 emitted from a light emitting portion 101 of the organic EL cell 10 becomes EL light 71 by transmitting through the second optical phase differential layer 6 and transmits through the second polarization layer 5. Accordingly, an observer 200 can visually identify the transmitted light as polarized EL light 218. On the other hand, EL light 80 emitted from the light emitting portion 101 of the organic EL cell 10 becomes EL light 81 by transmitting through the first optical phase differential layer 7, transmits through the first polarization layer 4, and is emitted to the external as the polarized EL light 219. In addition, external light 50 incident from the second polarization layer 5 side becomes linearly polarized light 51 by transmitting through the second polarization layer 5 having the transmission axis L1. Then, the linearly polarized light 51 becomes, for example, right circularly polarized light 52 by transmitting through the second optical phase differential layer 6 having the delay phase axis L2. The right circularly polarized light 52 is separated into right circularly polarized light 53 transmitting through the organic EL cell 10 and left circularly polarized light 55 reflected on the surface of the organic EL cell 10 and inner electrodes thereof. The right circularly polarized light 53 becomes linearly polarized light 54 by transmitting through the first optical phase differential layer 7 having the delay phase axis L3 and is absorbed in the first polarization layer 4 having the transmission axis L4. In addition, the left circularly polarized light 55 becomes linearly polarized light 56 by transmitting through the second optical phase differential layer 6 and is absorbed in the second polarization layer 5 having the transmission axis L1. Here, clockwise circularly polarized light is defined as the right circularly polarized light and counterclockwise circularly polarized light is defined as the left circularly polarized light. When the circularly polarized light 52 is left circularly polarized one, the circularly polarized light is separated into left circularly polarized light transmitting through the organic EL cell 10 and right circularly polarized light reflected on the surface of the organic EL cell and inner electrodes thereof. The left circularly polarized light then becomes the linearly polarized light 54 by transmitting through the first optical phase differential layer 7 having the delay phase axis L3 and is absorbed in the first polarization layer 4 having the transmission axis L4. In addition, the right circularly polarized light becomes the linearly polarized light 56 by transmitting through the second optical phase differential layer 6 and is absorbed in the second polarization layer 5 having the transmission axis L1.

Also, external light 60 incident from the first polarization layer 4 side becomes linearly polarized light 61 by transmitting through the first polarization layer 4 having the transmission axis L4. Then, the linearly polarized light 61 becomes, for example, left circularly polarized light 62 by transmitting through the first optical phase differential layer 7 having the delay phase axis L3. The left circularly polarized light 62 is separated into left circularly polarized light 63 transmitting through the organic EL cell 10 and right circularly polarized light 65 reflected on the surface of the organic EL cell 10 and inner electrodes thereof. The left circularly polarized light 63 becomes linearly polarized light 64 by transmitting through the second optical phase differential layer 6 having the delay phase axis L2 and is absorbed in the second polarization layer 5 having the transmission axis L1. The right circularly polarized light 65 is returned to linearly polarized light 66 by transmitting through the first optical phase differential layer 7 and absorbed in the first polarization layer 4 having the transmission axis L4. When the circularly polarized light 62 is right circularly polarized one, the circularly polarized light is separated into right circularly polarized light transmitting through the organic EL cell 10 and left circularly polarized light reflected on the surface of the organic EL cell 10 and inner electrodes thereof. The right circularly polarized light then becomes the linearly polarized light 64 by transmitting through the second optical phase differential layer 6 having the delay phase axis L2 and is absorbed in the second polarization layer 5 having the transmission axis L1. The left circularly polarized light becomes the linearly polarized light 66 by transmitting through the first optical phase differential layer 7 and absorbed in the first polarization layer 4 having the transmission axis L4.

As described above, the observer 200 visually identifies only the polarized EL light 218 on the black background. Therefore, an organic EL display device having an extremely high contrast is obtained. In addition, when the observer observes the polarized EL light 219 from the opposite side, the same effect is obtained.

In this embodiment, a polymer uniaxial stretched film produced by Nitto Denko Corporation is used for the optical phase differential layers. In addition, when a polymer liquid crystal film produced by Nippon Petrochemicals. Co., Ltd. is used, the same effect is obtained.

Also, the organic EL device of the embodiment as shown in FIG. 1 or the organic EL device of the embodiment as shown in FIG. 2 can be selected according to quality and cost if necessary.

(Embodiment 3)

Figure 3:
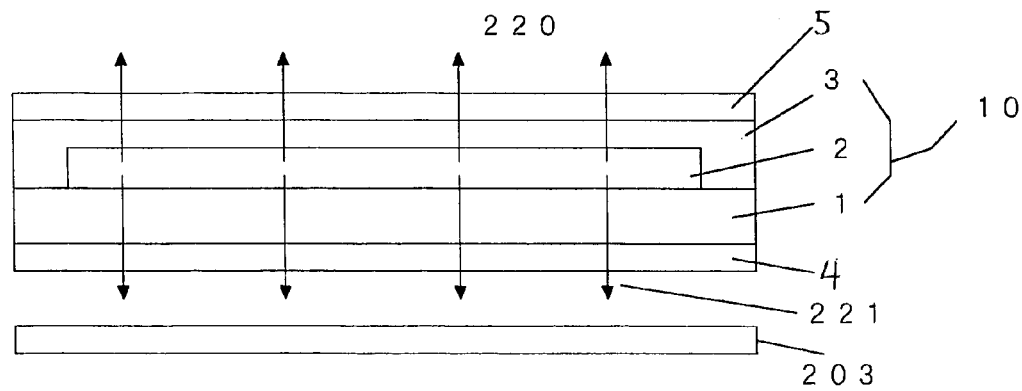
FIG. 3 is a schematic view showing a sectional structure of an organic EL device according to another embodiment of the present invention.
Figure 4:
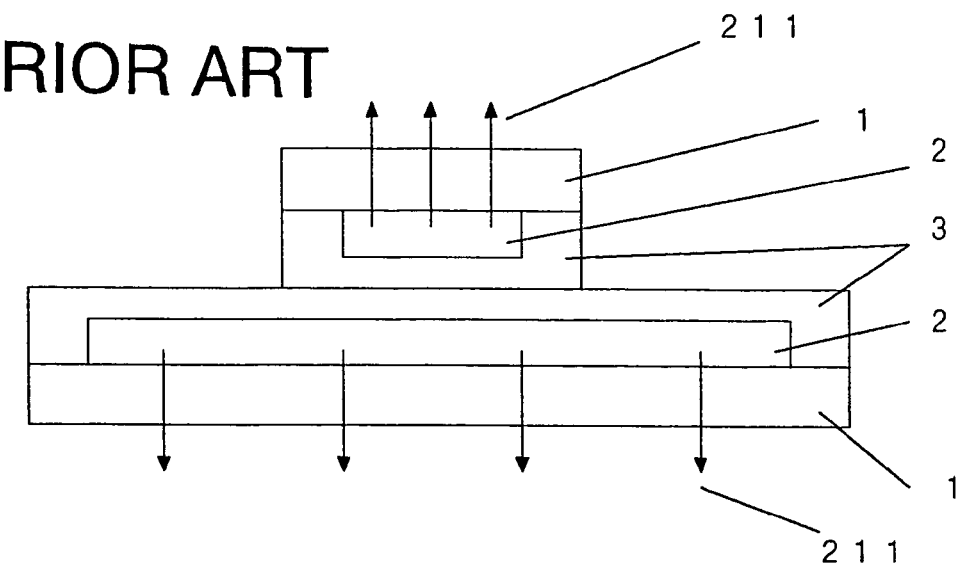
FIG. 4 is a schematic sectional view showing an organic EL device having a structure in which observation from front and rear sides is possible using a conventional organic EL element.
Figure 5:
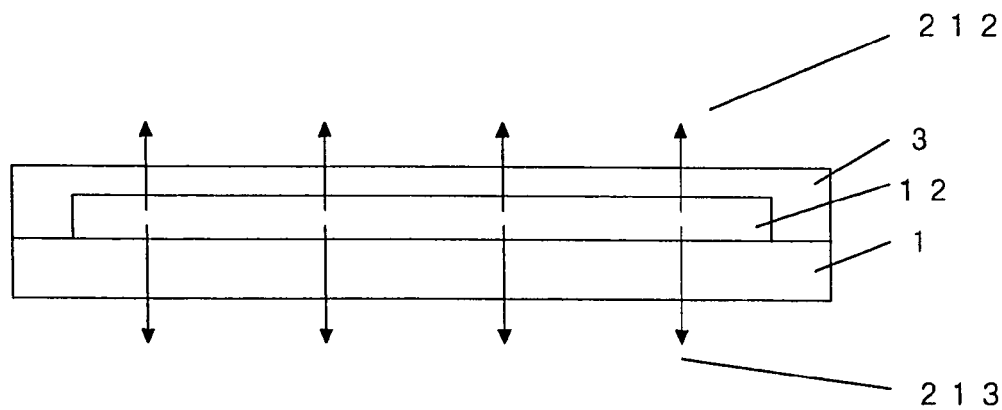
FIG. 5 is a schematic sectional view showing an organic EL device having a structure in which observation from front and rear sides is possible using a conventional organic EL element.
Figure 6:
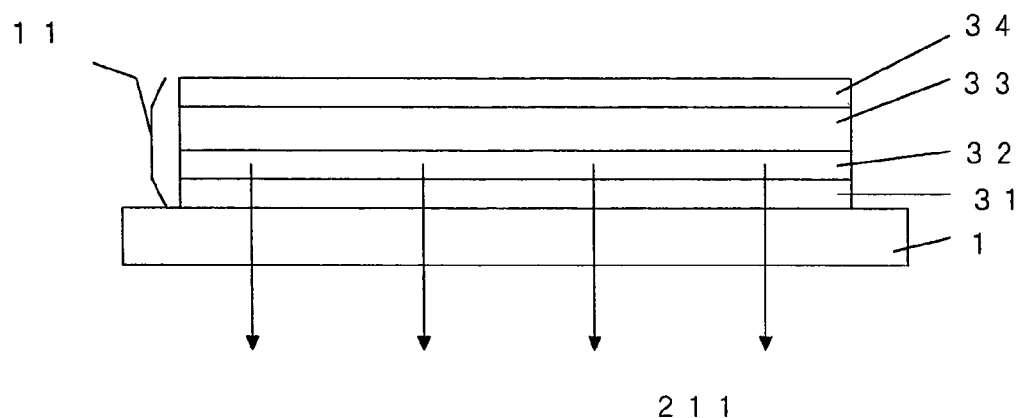
FIG. 6 is an explanatory view showing an example of a structure of the conventional organic EL element.

FIG. 3 is a schematic sectional view of an organic EL device of this embodiment. Note that the descriptions overlapped with above-mentioned respective embodiments are omitted here as appropriate. As shown in FIG. 3, the first polarization layer 4 and the second polarization layer 5 are disposed in both sides of the organic EL cell 10 such that transmission axes thereof are orthogonal to each other. In this embodiment, a polarizing plate is used for the polarization layers. Further, a privacy device in the form of a shutter 203 is located outside the first polarization layer 4 so as to correspond to a light emitting region of the organic EL cell 10. The case where the organic EL device shown in FIG. 3 is applied to a foldable information device having two foldable connected sections as shown in FIGS. 12 and 13 will be described as an example. In a state in which the information device is folded and the two sections overlap (FIG. 12), the shutter 203 is opened. Therefore, the observer 200 can visually identify polarized EL light 220. FIG. 13 shows a state in which the portable information device shown in FIG. 12 is opened and the two sections do not overlap (the shutter 203 is closed). In this state, the observer 200 can visually identify polarized EL light 221. However, because the polarized EL light 220 is blocked by the shutter 203, an observer 201 cannot view the display content. Thus, the privacy of the display data for the observer 200 can be maintained.

Figure 14:
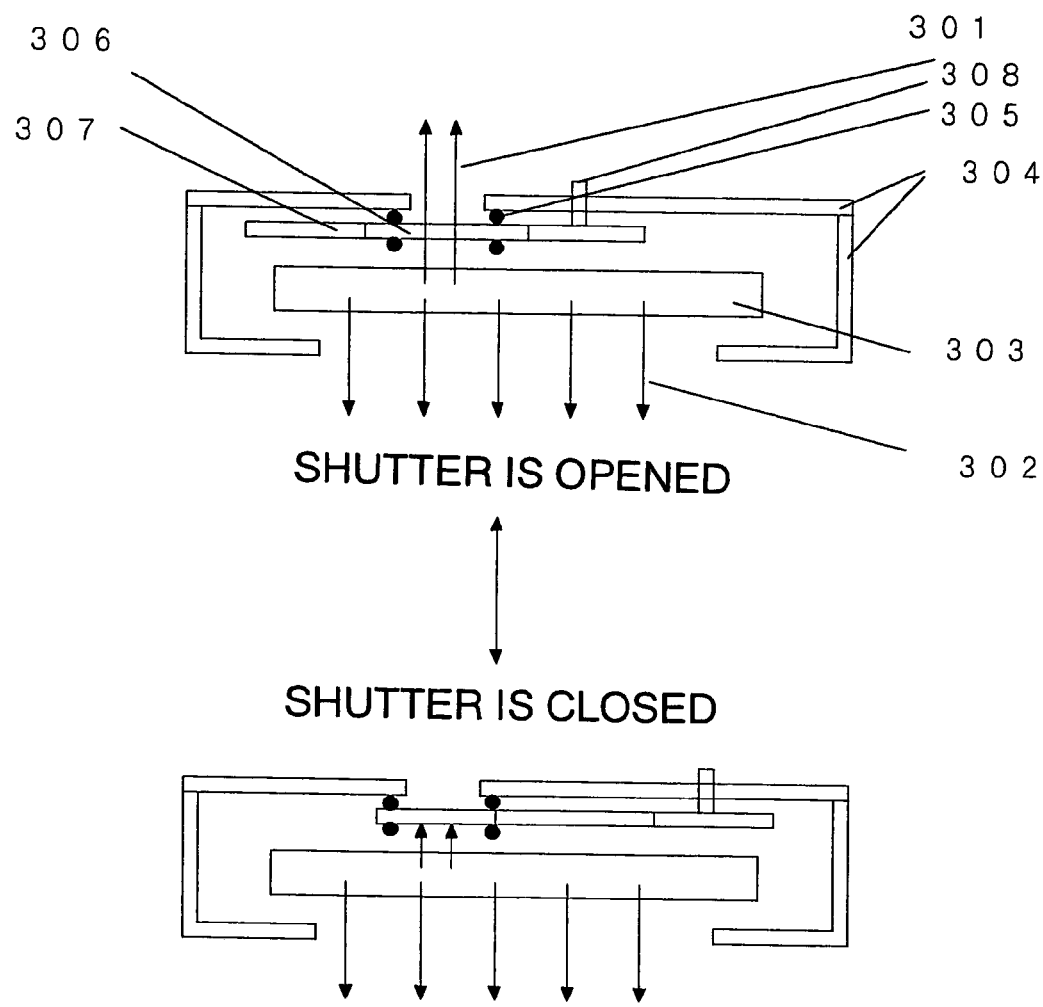
FIG. 14 is an explanatory view showing a shutter mechanism of the folding portable information device using the organic EL element of the present invention.

A mechanism of the shutter will be briefly described with reference to FIG. 14. EL light 301 and EL light 302 are emitted from both surfaces of an organic EL device 303. Data related to the EL light 301 and the EL light 302 are switched over by a program such that the data can be visually identified by the observer. The shutter is composed of an opaque portion 307 and a transparent portion 306. In addition, gears 305 for driving the shutter are provided and the shutter is opened or closed by a small size motor. Therefore, the opening control of the shutter can be automatically conducted according to the open and close states of the information device. That is, there is provided an automatic opening mechanism for closing the shutter when the information device is switched to the open or unfolded state and for opening the shutter when the information device is switched to the closed or folded state. Thus, a folding information device capable of protecting secrets can be realized. In addition, when a manually actuatable member such as a protruding portion 308 is connected to the shutter, the shutter can be manually opened or closed using the protruding portion 308. Accordingly, even when the automatic opening mechanism for the shutter produces trouble, a display content can be visually identified. Opening portions are provided in both sides of an exterior case 304 for the portable information device so as to be capable of ensuring a display content.

According to the self light emitting display device of the present invention, the optical layers are disposed so as to sandwich the self light emitting element, so that a double-sided display device in which a thickness thereof is small, a contrast is high can be realized. Further, the shutter is provided in one side, so that a folding information device capable of protecting secrets can be realized.

What is claimed is:

1. A self light emitting display device, comprising:
   a self light emitting element;
   a first polarization layer and a second polarization layer sandwiching therebetween the self light emitting element;
   a first optical phase differential layer (retardation: $\Delta n_1 d_1$ where $\Delta n$ is optical anisotropy and d is a thickness) provided between the self light emitting element and the first polarization layer; and
   a second optical phase differential layer (retardation: $\Delta n_2 d_2$) provided between the self light emitting element and the second polarization layer;
   wherein a transmission axis of the first polarization layer is parallel to a transmission axis of the second polarization layer; and
   wherein a delay phase axis of the optical anisotropy of the first optical phase differential layer ($\Delta n_1 d_1$) is parallel to a delay phase axis of the optical anisotropy of the second optical phase differential layer ($\Delta n_2 d_2$) and an angle produced by the delay phase axis and the transmission axis of the first polarization layer is set to block external light.

2. A self light emitting display device according to claim 1; wherein the values of $\Delta n_1 d_1$ and $\Delta n d_{2d}$ with respect to light having a wavelength $\lambda$ of 400 nm to 700 nm satisfy:

$$\Delta n_1 d_1/\lambda = 0.25 + m/2 \pm 0.05 \ (m=0, 1, 2, \ldots); \text{ and}$$

$$\Delta n_2 d_2/\lambda = 0.25 + m/2 \pm 0.05 \ (m=0, 1, 2, \ldots).$$

3. A self light emitting display device according to claim 1; wherein one of a polymer stretched film and a polymer liquid crystal film is used for the first optical phase differential layer or the second optical phase differential layer.

4. a self light emitting display device according to claim 1; further comprising a display portion closing mechanism for selectively masking at least a portion of a light emitting region of the self light emitting element.

5. A self light emitting display device according to claim 1; wherein the self light emitting display device has a foldable structure; and further comprising a display portion closing mechanism automatically movable to opened and closed positions to unmask and mask, respectively, at least a portion of a light emitting region of the self light emitting element in accordance with a folding state of the device such that the display portion closing mechanism is moved to the opened position when the device is in a folded state and is moved to the closed position when the device is in an unfolded state.

6. a self light emitting display device according to claim 5; further including a manually movable member for manually moving the display portion closing mechanism to the opened and closed positions.

7. A portable, foldable device having an electroluminescent display, the device comprising:
   two sections foldably connected together and having a folded state in which the two sections overlap one another and an unfolded state in which the two sections do not overlap one another; an electroluminescent element disposed in one of the sections for emitting and transmitting light through a side of the one section; and a privacy device for automatically preventing transmission of the light through the side of the one section when the two sections are in the unfolded state and permitting transmission of the light through the side of the one section when the two sections are in the folded state.

8. A portable, foldable device according to claim 7; wherein the electroluminescent element emits and transmits light through two opposed sides of the one section; and the privacy device prevents transmission of the light through one side while permitting transmission of the light through the other side when the two sections are in the unfolded state.

9. A portable, foldable device according to claim 8; wherein the privacy device comprises a movable shutter movable in accordance with the unfolding and folding of the two sections for preventing and permitting transmission of the light through the one side.

10. A portable, foldable device according to claim 9; wherein the shutter has an opaque portion for blocking transmission of the light and a transparent portion for permitting transmission of the light.

11. A portable, foldable device according to claim 7; wherein the privacy device comprises a movable shutter movable in accordance with the unfolding and folding of the two sections for preventing and permitting transmission of the light through the side.

12. A portable, foldable device according to claim 11; wherein the shutter has an opaque portion for blocking transmission of the light and a transparent portion for permitting transmission of the light.

13. A portable, foldable device according to claim 7; wherein the electroluminescent element comprises a self light emitting element, a first polarization layer and a second polarization layer sandwiching therebetween the self light emitting element; a first optical phase differential layer (retardation: $\Delta n_1 d_1$ where $\Delta n$ is optical anisotropy and d is a thickness) provided between the self light emitting element and the first polarization layer; and a second optical phase differential layer (retardation: $\Delta n_2 d_2$) provided between the self light emitting element and the second polarization layer; wherein a transmission axis of the first polarization layer is parallel to a transmission axis of the second polarization layer; and wherein a delay phase axis of the optical anisotropy of the first optical phase differential layer ($\Delta n_1 d_1$) is parallel to a delay phase axis of the optical anisotropy of the second optical phase differential layer ($\Delta n_2 d_2$) and an angle produced by the delay phase axis and the transmission axis of the first polarization layer is set to block external light.

14. A self light emitting display device according to claim 13; wherein the values of $\Delta n_1 d_1$ and $\Delta n_2 d_1$ with respect to light having a wavelength $\lambda$ of 400 nm to 700 nm satisfy:

$$\Delta n_1 d_1/\lambda = 0.25 + m/2 \pm 0.05 (m=0, 1, 2, \ldots); \text{ and}$$

$$\Delta n_2 d_2/\lambda = 0.25 + m/2 \pm 0.05 (m=0, 1, 2, \ldots).$$

15. A self light emitting display device according to claim 13; wherein one of a polymer stretched film and a polymer liquid crystal film is used for the first optical phase differential layer or the second optical phase differential layer.

* * * * *